United States Patent
Singh et al.

(12)

(10) Patent No.: US 11,313,903 B2
(45) Date of Patent: Apr. 26, 2022

(54) PIN DRIVER AND TEST EQUIPMENT CALIBRATION

(71) Applicant: Analog Devices, Inc., Norwood, MA (US)

(72) Inventors: Amit Kumar Singh, Woburn, MA (US); Christopher C. McQuilkin, Hollis, NH (US); Brian Carey, Stow, MA (US)

(73) Assignee: Analog Devices, Inc., Norwood, MA (US)

( * ) Notice: Subject to any disclaimer, the term of this patent is extended or adjusted under 35 U.S.C. 154(b) by 44 days.

(21) Appl. No.: 17/071,609

(22) Filed: Oct. 15, 2020

(65) Prior Publication Data

US 2022/0099738 A1    Mar. 31, 2022

Related U.S. Application Data

(63) Continuation-in-part of application No. 17/038,598, filed on Sep. 30, 2020.

(51) Int. Cl.
| | |
|---|---|
| *G01R 31/67* | (2020.01) |
| *G01R 31/317* | (2006.01) |
| *G01R 31/26* | (2020.01) |
| *G01R 31/319* | (2006.01) |

(52) U.S. Cl.
CPC ... *G01R 31/31713* (2013.01); *G01R 31/2632* (2013.01); *G01R 31/3191* (2013.01); *G01R 31/31723* (2013.01); *G01R 31/31926* (2013.01)

(58) Field of Classification Search
CPC ........ G01R 31/31713; G01R 31/31723; G01R 31/3191; G01R 31/31926; G01R 31/31908; G01R 31/2601; G01R 31/2632; G01R 31/318572; G01R 31/318541; G01R 31/3167; G01R 31/318555
See application file for complete search history.

(56) References Cited

U.S. PATENT DOCUMENTS

| | | | |
|---|---|---|---|
| 5,467,024 A * | 11/1995 | Swapp | G01R 31/2851 |
| | | | 324/73.1 |
| 7,453,258 B2 * | 11/2008 | Miller | G01R 31/3008 |
| | | | 324/750.02 |

(Continued)

OTHER PUBLICATIONS

"1.25 GHz Dual Integrated DCL with PPMU, Level Setting DACs, and On-Chip Calibration Registers", (2015), 82 pgs.

*Primary Examiner* — Thang X Le
(74) *Attorney, Agent, or Firm* — Schwegman Lundberg & Woessner, P.A.

(57) ABSTRACT

A force-sense system can provide signals to, or receive signals from, a device under test (DUT) at a first DUT node. The system can include output buffer circuitry configured to provide a DUT signal to the DUT in response to a force control signal at a buffer control node, and controller circuitry configured to provide the force control signal at the buffer control node. The system can include bypass circuitry configured to selectively bypass the controller circuitry and provide an auxiliary control signal at the buffer control node. The auxiliary control signal can be used for system calibration. In an example, an external calibration circuit can provide the auxiliary control signal in response to information received from the DUT.

20 Claims, 4 Drawing Sheets

(56) References Cited

U.S. PATENT DOCUMENTS

| | | | |
|---|---|---|---|
| 2003/0057990 A1* | 3/2003 | West | G01R 31/31924 324/750.01 |
| 2004/0186675 A1* | 9/2004 | Larson | G01R 31/3191 702/91 |
| 2006/0279310 A1* | 12/2006 | Walker | G11C 29/56 324/762.01 |
| 2008/0218173 A1* | 9/2008 | de la Puente | G01R 31/31924 324/537 |
| 2017/0067959 A1* | 3/2017 | King | G01R 31/2879 |

\* cited by examiner

PIN DRIVER AND TEST EQUIPMENT CALIBRATION

CROSS-REFERENCE TO RELATED APPLICATIONS

This patent application is a continuation-in-part of, and claims the benefit of priority of, U.S. patent application Ser. No. 17/038,598, entitled "Partitioned Force-Sense System for Test Equipment," filed on Sep. 30, 2020, which is hereby incorporated herein by reference in its entirety.

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple different classes of driver circuits to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a per-pin parametric measurement unit (PPMU or PMIU). A PMU can be configured to operate in different modes to provide, or force, a current or voltage signal and to receive, or measure, a corresponding response from a DUT. The operating modes can include, for example, a force voltage measure current (FVMI) mode, a force current measure voltage (FIMV) mode, a force current measure current (FIMI) mode, a force voltage measure voltage (FVMV) mode, or a force nothing measure voltage (FNMV) mode. A PMU can have various force and sense operating ranges that can be modified using, for example, external amplifiers or resistors.

In an example, a test system can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a 50 ohm resistor, which is then connected to the DUT node. Transitions between the three levels can be realized by opening and closing the appropriate switches, such as with one switch closed at any given time. A test system can include other functions, such as an active load and high-speed comparator. The active load can provide the DUT with a bi-directional current source load, and the comparator can serve as a DUT waveform digitizer.

BRIEF SUMMARY

The present inventors have recognized, among other things, that a problem to be solved includes providing a packaged automated test system configured to provide driver, comparator, active load, and per-pin parametric measurement functions. The inventors have recognized the problem includes accommodating the speed and accuracy requirements of, for example, the driver, comparator, and active load circuitry using integrated device structures that occupy minimal die area, while minimizing loading effects at an interface with a device under test (DUT), and while maximizing a functional test range of the system. The problem can include providing a system that is relatively small, inexpensive to produce, consumes less power than traditional systems, or provides higher fidelity performance relative to traditional systems.

The present inventors have further recognized that the problem can include providing a test system that can be calibrated by a user. For example, automated test systems can be provided as a single channel or multiple channel (dual, quad, octal, etc.) solution, such as on the same chip. A user generally calibrates each channel using a reference source or reference force-measure device. In some examples, a user may apply external switches to gain access to a DUT pin on each channel. However, various problems can arise with such switches, including switch size, resistance, loading on the DUT pin, and calibration range.

In an example, a solution to these and other problems can include or use a force-sense system with integrated switches to selectively permit auxiliary control of one or more portions of the force-sense system and to permit DUT access. The force-sense system can include interface nodes for carrying out system-level calibration, and the interface nodes can be configured to provide current or voltage information from a DUT to external calibration circuitry. An interface node can be configured to receive an auxiliary control signal, such as can be used to control an output of the force-sense system. In an example, the solution can include a diode-protected, externally-accessible node to receive a current signal at a DUT interface node.

In an example, a solution to the various problems articulated above, among others, can include or use a partitioned force-sense system. The solution can include, for example, a first portion of the force-sense system that is implemented using a first integrated circuit, a second portion of the same force-sense system that is implemented using a different second integrated circuit, and a first interface coupling the first and second portions of the force-sense system. In an example, the first interface comprises an electrically conductive, dual-purpose signal path coupling the first and second portions of the force-sense system. The second portion of the force-sense system can be coupled to a DUT interface. In an example, the switches to enable auxiliary control of the system can be implemented in the first portion of the force-sense system, such as on the first integrated circuit.

In an example, the solution can further include using different semiconductor substrates or different manufacturing processes to implement or build the different first and second portions of the force-sense system. For example, the solution can include using different first and second semiconductor materials for the first and second portions of the force-sense system. In an example, the first portion of the force-sense system can comprise a complementary metal-oxide semiconductor (CMOS) wafer, and the second portion of the force-sense system can comprise a different type of wafer, such as a bipolar device-based wafer. In an example, the solution can include PMU circuitry built using CMOS and bipolar processes, and higher-current driver and active load circuitry built using a different process, such as a bipolar process. In an example, portions of the PMU circuitry can be distributed across dies that are built using different processes with an interface provided between the dies.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A test system, such as a force-sense test system for use with automated test equipment (ATE), can be configured to provide a voltage or current stimulus to a device under test (DUT) at a specified time, and optionally can measure a response from the DUT. The test system can be configured to provide high fidelity output signal pulses over a relatively large output signal magnitude range to accommodate different tests and different types of devices under test.

In an example, a force-sense system, or force-sense measurement device, can include a pin driver architecture that can provide high fidelity stimulus signals with minimal overshoot or spiking of high frequency current signals, and can enhance pulse edge placement accuracy and signal bandwidth at high or low power operating levels. The test system can include a single-package ATE solution that can include, among other things, a driver circuit, comparator circuit, and active load circuit, and a per-pin parametric measurement unit (PPMU or PMU), sometimes referred to herein as a PMU circuit. The driver, comparator, and active load circuits are referred to herein collectively as a DCL or DCL circuit. In an example, the PMU circuit can be configured for use in high precision, relatively lower frequency, lower bandwidth, and higher amplitude stimulus testing and the DCL circuit can be configured for use in relatively higher frequency and higher bandwidth stimulus testing. Control circuitry can be provided to select a particular force stimulus, such as from the PMU circuit or the DCL circuit, for use in a particular test depending on parameters or requirements of the test. In some examples, operation of the PMU circuit and the DCL circuit can be mutually exclusive such that only one of the circuits interfaces with the DUT at any given time. Various other control circuitry can be provided, such as including digital-to-analog converters (DACs) with on-chip calibration registers to enable use at different DC operating levels.

In an example, the force-sense system can include a single channel or multiple channel system, with calibration capability for each channel. The system can include integrated, user-accessible terminals or nodes to receive control signals or reference signals from an external system or user. The system can be configured to provide information about the test system itself or about information sensed from a DUT using the system or a portion thereof. The system with integrated terminals can help reduce adverse loading and enhance a calibration signal test range (e.g., in terms of signal magnitude or signal bandwidth) over traditional test systems.

Figure 1:
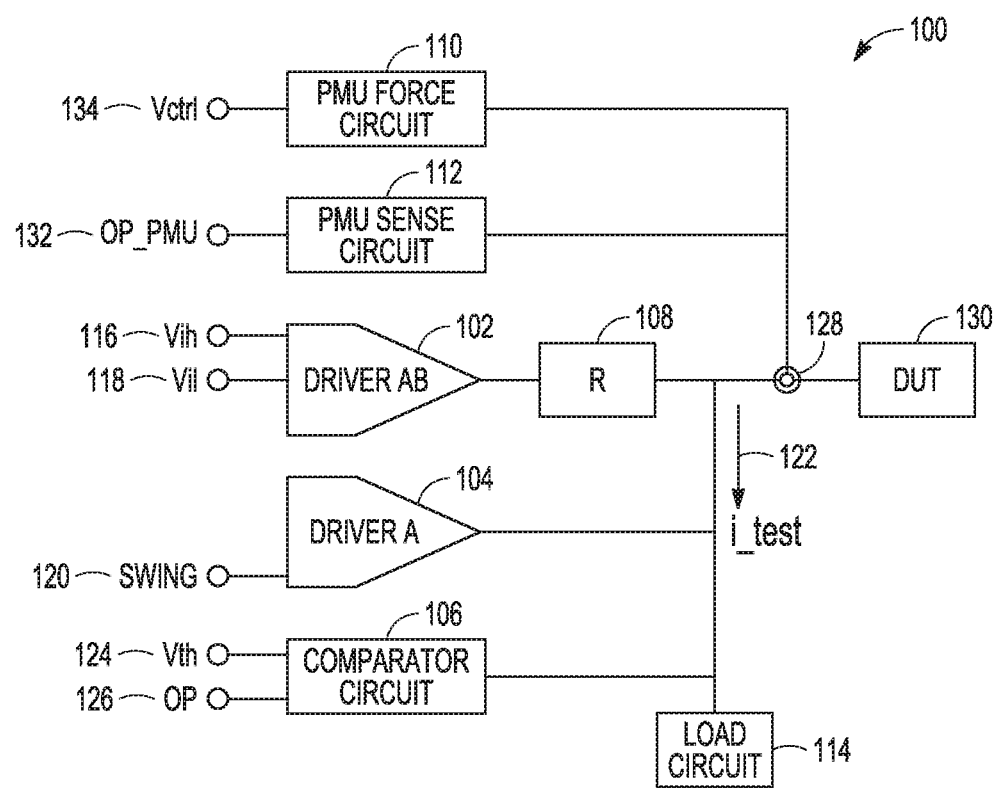
FIG. 1 illustrates generally an example of a force-sense test system topology including multiple driver circuits.

FIG. 1 illustrates generally a first example 100 of a force-sense test system topology including a PMU circuit and a DCL circuit. In the first example 100, the PMU circuit includes a PMU force circuit 110 and a PMU sense circuit 112 coupled to a DUT pin 128, and the DUT pin 128 can be coupled to a DUT 130. In the first example 100, the DCL circuit includes a first DriverAB 102 that can include a class AB driver circuit, and a first DriverA 104 that can include a class A driver circuit. The DCL circuit can include a comparator circuit 106 and a first load circuit 114, such as can include an active load or other loading device. The first example 100 can further include an output element such as a first resistor 108 that can be configured to provide a specified output or load impedance. In an example, the test system is configured to source or sink a first current signal 122, i_test, at the DUT pin 128 that is coupled to the DUT 130. The force-sense test system can be configured to concurrently perform voltage and current measurements on signals received from, or provided to, the DUT 130, such as while applying a voltage or current excitation stimulus to the DUT 130.

In an example, the PMU force circuit 110 can be configured to provide a stimulus using a digitally-configurable amplifier circuit and one or more output buffers. The PMU force circuit 110 can receive a digital control signal, such as a PMU control signal 134 Vctrl, and in response, the PMU force circuit 110 can provide a drive signal at the IDIT pin 128. The PMU sense circuit 112 can be configured to receive voltage or current information from the DUT 130, such as using a resistive network. The PMU circuit can include a feedback network to receive test control signals, and the voltage or current information from the DUT 130, to thereby control operation of the PMU force circuit 110. In an example, the PMU sense circuit 112 can be configured to provide a PMU output signal 132 OP_PMU, such as to an external system controller.

In an example, the first DriverAB 102 can be configured to produce a voltage stimulus signal by selecting between parallel-connected diode bridges with each bridge driven by a unique, dedicated DC voltage level In the first example 100 of FIG. 1, DC voltages Vih 116 and Vil 118 drive diode bridges in the first DriverAB 102. The switching stage can be followed by a voltage buffering stage that can provide power gain, such as can be used to produce large currents to serve a 50 ohm DUT environment.

In contrast with the first DriverAB 102, the first DriverA 104 can be configured to produce transitions at the DUT 130 using a relatively large current switch stage that can be coupled directly to the DUT 130. A current switching stage in the first DriverA 104 can alternately switch current into and out of the DUT 130 in response to a control signal Swing 120, such as can be a voltage control signal. The first DriverA 104 can provide high speed operation, for example, because it may be unburdened by the class AB voltage buffering stage with its attendant bandwidth limitations and other performance limitations.

In an example, the first DriverA 104 can be configured to provide a relatively low amplitude signal at the DUT 130. For example, the first DriverA 104 can provide a signal having about a 2 volt swing. The first DriverAB 102 can be configured to provide a relatively high amplitude signal at the DUT 130, for example, −1.5 to +7 volts. The first DriverA 104 generally operates at a higher switching speed or bandwidth than the first DriverAB 102. In an example, the first DriverAB 102 can be configured to absorb switching currents from the first DriverA 104. That is, the first DriverAB 102 can serve as a buffer that the first DriverA 104 can source current into, such as through the first resistor 108.

One or more of the PMU force circuit 110, the first DriverAB 102 and the first DriverA 104 can be selected to fulfill disparate DUT test requirements that may not otherwise be fulfilled by a single driver. For example, while each of the driver circuits can provide DUT signals or waveforms, the first DriverAB 102 can be configured to provide large amplitude, low bandwidth stimulus signals, and the first DriverA 104 can be configured to provide low amplitude, high bandwidth stimulus signals. The PMU force circuit 110, for example, can be configured to provide high amplitude current and voltage signals such as at DC or low bandwidth levels.

In an example, the PMU circuit and the DCL circuit include respective independent enable control pins. The independent enable controls can help facilitate independent operation of the different circuits. For example, the first DriverAB 102 can serve as a low speed, high voltage stimulus source, or can serve as a static, non-transitioning buffer to absorb switching currents from the first DriverA 104, such as depending on a state of a control signal at the enable control pin of the first DriverAB 102. In an example, the first DriverAB 102 and the first DriverA 104 can be disabled when the PMU circuit is active, and the PMU circuit can be disabled when one of the first DriverAB 102 and the first DriverA 104 is active.

FIG. 1 includes the comparator circuit 106. The comparator circuit 106 can include a multiple-stage comparator that is configured to receive signals from the DUT 130, such as via the DUT pin 128. The comparator circuit 106 can compare the received signals to a comparator reference signal 124 and, in response, provide a differential comparator output signal 126. For example, the comparator circuit 106 can receive a voltage response signal from the DUT 130 and compare an amplitude of the voltage response signal to an amplitude of the comparator reference signal 124. The comparator circuit 106 can provide information about the amplitude relationship using the differential comparator output signal 126, such as can include a digital signal or logic output signal.

Figure 2:
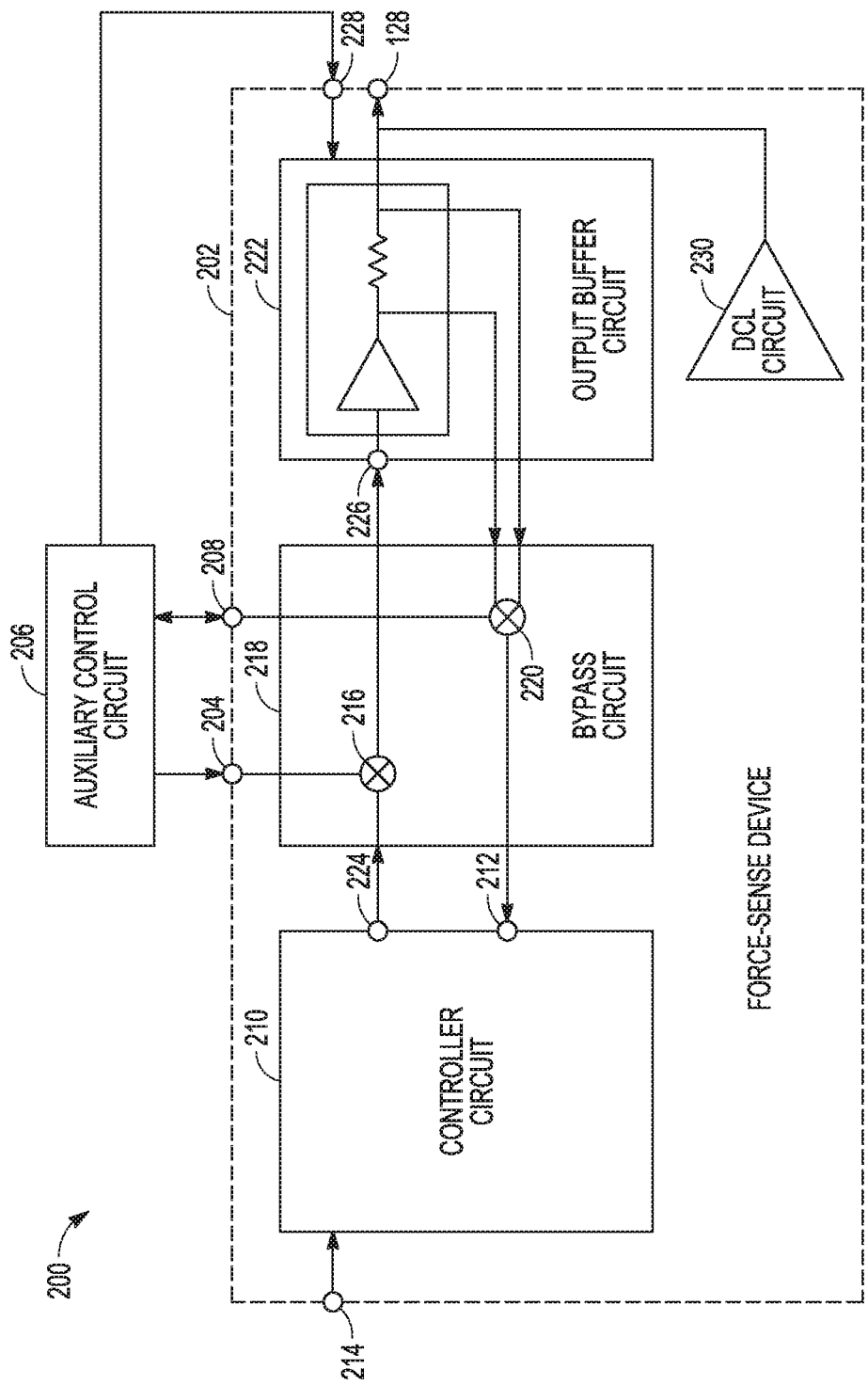
FIG. 2 illustrates generally a schematic example of a test system that includes a controller circuit, a bypass circuit interfaced with an external calibration circuit, and an output buffer circuit.

FIG. 2 illustrates generally a schematic example of a test system that includes a controller circuit, a bypass circuit interfaced with an external calibration circuit, and an output buffer circuit. For example, FIG. 2 includes a first force-sense test system 200 that includes a force-sense device 202 coupled to an auxiliary control circuit 206. The force-sense device 202 includes components that comprise a per-pin parametric measurement unit or a PMU circuit, and components that comprise a DCL circuit 230 including other driver, comparator, and active load circuitry. The PMU circuit can be selectively controlled by a local controller in the force-sense device 202 or can be controlled using the auxiliary control circuit 206.

The example of FIG. 2 can include or use various circuits, components, or functional blocks from the example of FIG. 1. For example, the force-sense device 202 can include the PMU circuit coupled to the same DUT pin 128 as the DCL circuit 230, such as similarly described above in the example of FIG. 1. The PMU circuit can be configured to support high precision, low bandwidth or DC force-sense interactions with the DUT 130, and the DCL circuit 230 can be configured to support relatively high speed force-sense interactions with the DUT 130. In the example of FIG. 2, the DCL circuit 230 and the PMU circuit are coupled at the DUT pin 128. The DCL circuit 230 can include the first DriverAB 102, the first DriverA 104, the comparator circuit 106, the first load circuit 114, the first resistor 108, or other circuits or components configured to support relatively high speed force-sense interactions with the DUT 130.

Circuits and components in the force-sense device 202, such as other than those that comprise the DCL circuit 230, can comprise the PMU force circuit 110 and the PMU sense circuit 112. In the example of FIG. 2, the PMU circuit comprises a controller circuit 210, a bypass circuit 218, and an output buffer circuit 222. The PMU circuit can be selectively coupled to the auxiliary control circuit 206 using the bypass circuit 218. The force-sense device 202 can include a first calibration input node 228, an auxiliary input node 204, and a DUT information output node 208 to interface with the auxiliary control circuit 206. The output buffer circuit 222 can be coupled to the DUT pin 128 via an output node, and the output buffer circuit 222 can be coupled to the auxiliary control circuit 206 via the first calibration input node 228.

In the example of FIG. 2, the bypass circuit 218 can be coupled to the auxiliary control circuit 206 via the auxiliary input node 204 and via the DUT information output node 208. The auxiliary control circuit 206 can be configured to receive information from or about the DUT from the bypass circuit 218, and the auxiliary control circuit 206 can provide auxiliary control over one or more portions of the force-sense device 202, such as control over the output buffer circuit 222. In an example, the auxiliary control circuit 206 can be configured to drive or load the DUT pin 128 directly via the first calibration input node 228.

In an example, the controller circuit 210 can receive a test control signal at a test control input node 214 and can receive information from or about a DUT, such as via a local DUT information node 212. In response to the DUT information and the test control signal, the controller circuit 210 can provide a signal at a force control output node 224. For example, the controller circuit 210 can provide a force control signal or a DUT force signal at the force control output node 224. The controller circuit 210, such as can be understood to be a local controller for the PMU circuit, can provide the force control signal to a buffer control node 226 at the output buffer circuit 222 and, in response, one or more output buffers in the output buffer circuit 222 can be activated and provide a signal at the DUT pin 128. In an example, the controller circuit 210 includes a feedback network that is configured to receive the test control signal and the DUT information from the local DUT information node 212. The feedback network can be used to update characteristics of the force control signal or of the force signal to be provided by the controller circuit 210.

In an example, the bypass circuit 218 can include circuitry that is configured to selectively enable auxiliary control of the output buffer circuit 222. That is, the bypass circuit 218 can select Which of multiple different control signals to provide to the output buffer circuit 222 at the buffer control node 226. For example, switching circuitry in the bypass circuit 218 can enable direct communication between the controller circuit 210 and the output buffer circuit 222, or the switching circuitry can interrupt communication from the controller circuit 210 such that the output buffer circuit 222 is under auxiliary control. In the example of FIG. 2, the bypass circuit 218 includes a first switching circuit 216 that can be configured to receive two signals and provide a selected one of the received signals to the output buffer circuit 222. For example, the first switching circuit 216 can be configured to receive a local control signal from the controller circuit 210 via the force control output node 224, and to receive an auxiliary control signal from the auxiliary control circuit 206 via the auxiliary input node 204. The first switching circuit 216 can select the local or auxiliary control signal depending on an operating mode of the first force-sense test system 200. For example, when the PMIU circuit is under local control, then the first switching circuit 216 can select the local control signal from the controller circuit 210. When the PMU circuit is under auxiliary control, such as during calibration, then the first switching circuit 216 can select the auxiliary control signal from the auxiliary control circuit 206.

The bypass circuit 218 can further include circuitry configured to control communication of various DUT information to or from the auxiliary control circuit 206. For example, the bypass circuit 218 can use the DUT information output node 208 to communicate current information and/or voltage information about signals received from the DUT to an external system or device, or to the auxiliary control circuit 206. In an example, the bypass circuit 218 can include a second switching circuit 220 that can be configured to receive respective DUT information signals that represent or indicate a DUT voltage or a DUT current. The second switching circuit 220 can route one or more of the DUT information signals to the controller circuit 210 or to the auxiliary control circuit 206, such as depending on the operating mode of the first force-sense test system 200.

Figure 3:
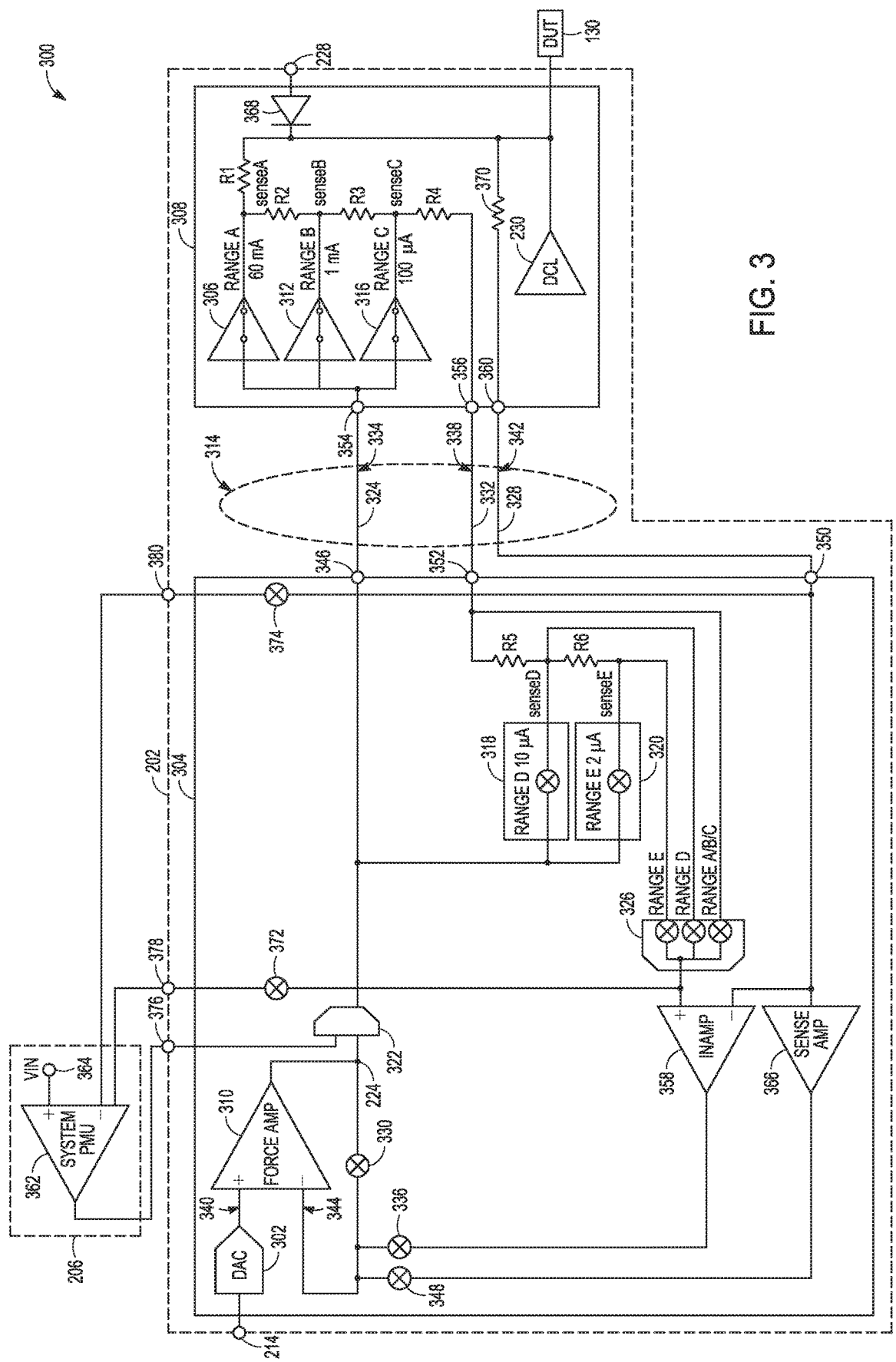
FIG. 3 illustrates generally an example of a partitioned test system with external calibration circuit.

The force-sense device 202 can comprise one integrated circuit, such as can be built using a particular semiconductor die of a particular semiconductor type. In an example, the force-sense device 202 can comprise multiple different integrated circuits, such as can be built using similar or dissimilar dies. That is, different integrated circuits, such as corresponding to different portions of the force-sense device 202, can comprise different semiconductors of different types. For example, a front-end portion of the PMU circuit can comprise a CMOS-type semiconductor, while other portions of the PMU circuit and/or the DCL circuit 230 can comprise a different type of semiconductor. FIG. 3 illustrates an example that includes portions of the force-sense device 202 built using different semiconductors.

FIG. 3 illustrates generally a schematic example of a test system including a first portion with a parametric measurement unit, and a second portion with a driver, comparator, and active load. For example, FIG. 3 includes a multiple-die force-sense test system 300 that includes the force-sense device 202, the DUT 130, and the auxiliary control circuit 206. The force-sense device 202 includes components that comprise a per-pin parametric measurement unit or a PMU circuit, and components that comprise the DCL circuit 230 including other driver, comparator, and active load circuitry. The force-sense device 202 can be operable in multiple different modes, including a test mode, such as under local control, and an auxiliary control mode. The auxiliary control circuit 206 can be used to operate the force-sense device 202 in the auxiliary control mode. In an example, the auxiliary control mode can be used to calibrate various aspects of the test system and can include a force calibration mode to calibrate output drive or buffer components in the force-sense device 202, and a sense calibration mode to calibrate sense circuitry or sense components in the force-sense device 202.

The example of FIG. 3 illustrates that various aspects of the force-sense device 202 can be distributed across, or built on, multiple different semiconductor devices, and can be connected using an interface. For example, the multiple-die force-sense test system 300 can include a first semiconductor device 304 coupled to a second semiconductor device 308 using a device interface 314. The second semiconductor device 308 can be coupled to the DUT 130. The different portions of the force-sense device 202 can be built using different semiconductor devices of different semiconductor device types as further discussed below.

The example of FIG. 3 can include or use various circuits, components, or functional blocks from the examples of FIG. 1 and/or FIG. 2. For example, the force-sense device 202 can include the PMU circuit coupled to the same DUT pin 128 as the DCL circuit 230, such as similarly described above. The force-sense device 202 can communicate with the auxiliary control circuit 206 using one or more user-accessible nodes. In an example, the force-sense device 202 can include a first calibration input node 228 configured to receive a calibration test signal from the auxiliary control circuit 206. The force-sense device 202 can include a DUT current sense node 378 configured to provide information about a DUT current signal to the auxiliary control circuit 206, and a DUT voltage sense node 380 configured to provide information about a DUT voltage signal to the auxiliary control circuit 206. The force-sense device 202 can include an auxiliary input node 376 configured to receive an auxiliary control signal from the auxiliary control circuit 206.

Circuits and components in the force-sense device 202, such as other than those that comprise the DCL circuit 230, can comprise the PMU force circuit 110 and the PMU sense circuit 112 of the PMU in the force-sense device 202. For example, the PMU circuit can include the controller circuit 210, such as in a front-end portion of the PMU circuit, with a digital-to-analog converter circuit, or first DAC 302, and a first force amplifier 310. The first force amplifier 310 can be configured to provide a buffer drive signal.

The PMU circuit can include a force control feedback network with switches that are configured to control a flow of information from the DUT 130 to differential inputs of the first force amplifier 310. For example, the force control feedback network can include a sense amplifier output switch 348 configured to selectively couple an output of a sense amplifier circuit 366 to the first force amplifier 310, an instrumentation amplifier output switch 336 configured to selectively couple an output of an instrumentation amplifier circuit 358 to the first force amplifier 310, and a feedback switch 330 configured to selectively couple an output of the first force amplifier 310 to an input of the first force amplifier 310. The sense amplifier circuit 366 and the instrumentation amplifier circuit 358 can be configured to receive DUT voltage information or DUT current information from the DUT 130 that, in turn, can be used to generate a feedback signal for use by the force control feedback network.

In an example, the DUT circuit includes a DUT sense portion that is configured to receive or measure signals received from the DUT 130 via the DUT pin 128, such as by way of the DUT sense resistor 370 and/or using various force-sense resistors R1-R6. When a value of the DUT sense resistor 370 or the other force-sense resistors is known, information about a current signal from the DUT 130 can be determined based on the voltage across the particular resistor. In an example, the current signal information can be measured using the instrumentation amplifier circuit 358. The instrumentation amplifier circuit 358 can include a differential amplifier circuit that is configured to compare the current signal information from the DUT 130, such as received via the DUT sense resistor 370, with current information at a particular sense node in the output buffer circuitry of the PMU circuit.

In an example, the first DAC 302 can include a test control input node 214 to receive a control signal from an external test controller. A signal at the test control input node 214 can be specified by a user or program, such as to define one or more test parameters. In response to a signal at the test control input node 214, the first DAC 302 can provide a test control signal 340 to the first force amplifier 310. The first force amplifier 310 can receive the test control signal 340 and a DUT information signal 344 and provide, for example via the bypass circuit 218, one of a DUT drive signal for communication to the DUT 130, or a buffer control signal to control one or more buffer circuits in the output buffer circuit 222.

In an example, the bypass circuit 218 can include a first selector circuit 322 that is configured to receive information from the controller circuit 210 and from the auxiliary control circuit 206. The first selector circuit 322 in the example of FIG. 3 can correspond to the first switching circuit 216 from the example of FIG. 2. The first selector circuit 322 can be used to receive one or more control signals and provide a selected one of the control signals to the first device output node 346 (e.g., corresponding to the buffer control node 226 from the example of FIG. 2) to thereby control an output signal, or DUT drive signal, provided by one or more output buffers. For example, in a force calibration mode, the first selector circuit 322 can be configured to enable auxiliary control of buffers on the second semiconductor device 308 by communicating a signal from the auxiliary input node 376 to the second device input node 354 by way of the first device output node 346. That is, in the force calibration mode, a buffer in the output buffer circuit 222 can be under auxiliary control provided by the auxiliary control circuit 206. In a non-calibration mode or test mode, the first selector circuit 322 can be configured to communicate a signal from a local controller, such as the first force amplifier 310, to the second device input node 354 by way of the first device output node 346. The first selector circuit 322 can optionally include a multiplexer circuit, or various switch devices that are operated together in a coordinated manner, or can include a transmission gate or a bootstrapped switch.

In an example, buffers on the second semiconductor device 308, such as comprising the output buffer circuit 222 from the example of FIG. 2, can be configured to provide multiple different signal paths between the first selector circuit 322 and the DUT pin 128. Different buffers, or buffer instances, on the second semiconductor device 308 can be configured to operate mutually exclusively such that only one of the buffer instances operates at a particular time. In other examples, multiple buffer instances can be used together, in the example of FIG. 3, the buffers can include a first buffer circuit 306, a second buffer circuit 312, and a third buffer circuit 316, and each of the buffer circuits can be configured to provide a current signal in a different current magnitude range. Respective outputs of the different buffer circuits can be coupled to respective sense nodes that, in turn, can be coupled to respective portions of a resistive output network. In the example of FIG. 3, an output of the first buffer circuit 306 can be coupled through a first output resistor R1 to the DUT 130. An output of the second buffer circuit 312 can be coupled through a series combination of a second output resistor R2 and the first output resistor R1 to the DUT 130, and an output of the third buffer circuit 316 can be coupled through a series combination of a third output resistor R3, the second output resistor R2, and the first output resistor R1 to the DUT 130. Current magnitude information about a signal provided to the DUT 130 can be calculated based on known resistance characteristics of the resistive output network and voltage information measured from one or more of the sense nodes in the resistive output network. The same sense nodes of the resistive network can be used to read magnitude information about current signals that are received from the DUT 130.

In the example of FIG. 3, force circuitry and sense circuitry of the force-sense device 202 can be calibrated using the auxiliary control circuit 206. The auxiliary control circuit 206 can include a calibration input 364 to receive a user-specified calibration signal, Vin, from an external source. The auxiliary control circuit 206 can include a calibration amplifier 362 configured to receive the calibration input 364 and feedback information from the DUT 130. In an example, the calibration signal, Vin, can be provided by a DAC circuit in response to a digital calibration signal. The feedback information from the DUT 130 can be selectively provided from the force-sense device 202 to the auxiliary control circuit 206, for example, using a current sense switch 372 and a voltage sense switch 374. The calibration amplifier 362 can be coupled to the force-sense device 202 via the auxiliary input node 376 and can provide known signals (e.g., based on Vin) to the DUT 130 and to one or more other portions of the force-sense device 202. Response information or other behavior of the DUT or of the force-sense device 202 can be monitored or measured in response to the known drive signals to thereby enable user-calibration of the multiple-die force-sense test system 300.

In an example, in the force calibration mode, the first selector circuit 322 can be configured to transmit a signal from the auxiliary control circuit 206 to the first device output node 346, the feedback switch 330 can be closed, and the current sense switch 372 and the voltage sense switch 374 can be closed. In the force calibration mode, the first force amplifier 310 can be placed into a feedback mode to help prevent internal damage, such as to various portions of the PMU circuit. That is, in the force calibration mode, the calibration amplifier 362 in the auxiliary control circuit 206 provides a signal to control one or more of the buffers on the second semiconductor device 308 and the controller circuit 210 can be unused.

In the sense calibration mode, DUT sense circuitry, such as including various precision resistors in the force-sense device 202 (e.g., R1-R6 in the example of FIG. 3), can be calibrated. In an example, a current calibration signal can be received by the force-sense device 202 at the first calibration input node 228. A first diode 368 can be coupled between the first calibration input node 228 and other circuitry in the force-sense device 202, such as to help protect the other circuitry in the force-sense device 202 from potentially damaging external calibration signals. For example, the first diode 368 can be coupled between the first calibration input node 228 and the resistive network in the second semiconductor device 308. Other switches can optionally be provided at the first calibration input node 228, or between the first diode 368 and one or more of the DUT pin 128, the DCL circuit 230, the DUT sense resistor 370, or other portions of the output buffer circuitry.

Based on information about the current calibration signal and information received from the second selector circuit 326 via the inputs to the second selector circuit 326, accurate resistance values of the various sense resistors (e.g., R1-R6) can be determined. Thus calibration of the force-sense device 202 in each of multiple different current sense and drive ranges can be facilitated by providing a known current calibration signal and then measuring a corresponding response from respective ones of the inputs to the second selector circuit 326.

In an example, in a test mode, the first selector circuit 322 can be configured to transmit a signal from the controller circuit 210 to the first device output node 346, the feedback switch 330 can be open, and the current sense switch 372 and voltage sense switch 374 can be open. In the test mode, the first force amplifier 310 can provide a signal to control the output buffer circuitry while other drive circuitry, such as the calibration amplifier 362 in the auxiliary control circuit 206, can be unused.

In an example, the force-sense device 202 can be configured for clamping at the DUT pin 128 to help avoid or prevent damage to the force-sense device 202, such as when the device is in a calibration mode. Clamp circuitry can be configured to clamp the output of the first force amplifier 310 if the voltage or current applied to the DUT 130 exceeds specified upper or lower clamp levels. The clamp circuitry also comes into play in the event of a short or open circuit. The clamp circuitry can also protect the DUT 130 if a transient voltage or current spike occurs when changing to a different operating mode, or when programming the device to a different current range. In an example, if a voltage at the DUT pin 128 exceeds a specified threshold voltage during a calibration routine, then the first selector circuit 322 can decouple the auxiliary control circuit 206 and return system control to the controller circuit 210.

Table 1 describes state information for various switches and devices of the force-sense device 202 when the force-sense device 202 is in different operating modes. For example, Table 1 shows the relationship between statuses of the various switches and the first selector circuit 322 in the force calibration mode, the sense calibration mode, the test mode, and the clamp mode.

TABLE 1

Logic diagram for portions of the force-sense device 202.

| Device | Force Calibration Mode | Sense Calibration Mode | Test Mode | Clamp Mode |
| --- | --- | --- | --- | --- |
| First selector circuit 322 | Buffer control node 226 coupled to auxiliary input node 376 | Buffer control node 226 coupled to auxiliary input node 376 | Buffer control node 226 coupled to force control output node 224 | Buffer control node 226 coupled to force control output node 224 |
| Feedback switch 330 | Closed | Closed | Open | Open |
| Sense amplifier output switch 348 | Open | Open | Open in force current mode, closed in force | Open in force current mode, closed in force |
| Instrumentation amplifier output switch 336 | Open | Open | voltage mode Closed in force current mode, open in force voltage mode | voltage mode Closed in force current mode, open in force voltage mode |
| Current sense switch 372 | Closed | Closed | Open | Open |
| Voltage sense switch 374 | Closed | Closed | Open | Open |
| First calibration input node 228 | Unused | Active | Unused | Unused |

Although the example of FIG. 3 illustrates the first diode 368 being a component of the force-sense device 202, the first diode 368 can be similarly provided externally to the force-sense device 202. For example, the first diode 368 can be coupled to the first calibration input node 228 outside of the force-sense device 202, or the first diode 368 can be provided in the auxiliary control circuit 206.

The example of FIG. 3 illustrates generally the device interface 314 coupling the first semiconductor device 304 and the second semiconductor device 308. The device interface 314 can include one or more signal paths configured to communicate information between the different semiconductor devices. The one or more electrical conductors can be configured for unidirectional or bidirectional communication. A number of signal paths, or conductors, in the device interface 314 can be minimized to simplify interconnection between the different semiconductor devices.

In an example, the first semiconductor device 304, such as comprising a portion of the PMU circuit, can be a lower-cost, lower-speed semiconductor device on or with which integrated devices can be built. For example, the first semiconductor device 304 can comprise a CMOS-type die with which CMOS-type switch devices can be built. The second semiconductor device 308, such as comprising another portion of the PMU circuit, the DCL circuit 230, or other circuits, can be a higher-cost, higher-speed semiconductor device on or with which integrated devices can be built. For example, the second semiconductor device 308 can comprise a bipolar-type die with which bipolar-type switch devices can be built. The first semiconductor device 304 and its attendant manufacturing processes can include or use fewer masks, larger lithography, greater tolerances, and can have greater overall yield when compared to the second semiconductor device 308.

In the example of FIG. 3, the first semiconductor device 304 and the second semiconductor device 308 include various interface nodes in communication with the auxiliary control circuit 206. For example, the first semiconductor device 304 includes the auxiliary input node 376, the DUT current sense node 378, and the DUT voltage sense node 380, and the second semiconductor device 308 includes the first calibration input node 228.

The first semiconductor device 304 can further include various switch devices, including the sense amplifier output switch 348, the instrumentation amplifier output switch 336, the current sense switch 372, the voltage sense switch 374, and the feedback switch 330. In an example, the first semiconductor device 304 can include the first selector circuit 322, such as can comprise an integrated multiplexer device or discrete switches that are configured to implement the functions of a multiplexer. The various switches and the multiplexer can generally be more easily and more inexpensively implemented using the first semiconductor device 304 as compared to similar devices implemented using the second semiconductor device 308.

Integrating the switch devices with the first semiconductor device 304 of the multiple-die force-sense test system 300 provides various benefits for system calibration. For example, by providing the integrated switches, loading issues associated with external switches can be avoided, and a larger magnitude range of current signals can be used in calibration procedures. In an example without integrated switches providing access to drive circuitry in the test system, a large magnitude calibration current signal can be received by the test system using a relatively large external switch, and such a large switch can adversely load the DUT pin 128. Instead, by providing a calibration signal access point that is internal to the multiple-die force-sense test system 300, such as via the various integrated switches, external calibration circuitry can be used to control the integrated drive signal circuitry of the system, such as the output buffer circuitry of the multiple-die force-sense test system 300.

In the example of FIG. 3, the first semiconductor device 304 includes various device interface nodes for communicating with the second semiconductor device 308, such as using the device interface 314. The second semiconductor device 308 includes various device interface nodes for communicating with the first semiconductor device 304, such as using the device interface 314. For example, the first semiconductor device 304 includes a first device output node 346, a first device feedback node 350, and a first device dual-purpose node 352. The second semiconductor device 308 includes a second device input node 354, a second device feedback node 360, and a second device dual-purpose node 356. Various signal paths extending between the device interface nodes can comprise the device interface 314. For example, the device interface 314 can include a first signal path 324, a second signal path 328, and a bidirectional signal path 332. Generally, the first signal path 324 is a unidirectional signal path for communicating signals from the first semiconductor device 304 to the second semiconductor device 308, and the second signal path 328 is a unidirectional signal path for communicating signals from the second semiconductor device 308 to the first semiconductor device 304.

In an example, the first signal path 324 can transmit a force control signal 334 from the first semiconductor device 304 to the second semiconductor device 308. The first selector circuit 322 can be configured to provide the force control signal 334 at the first device output node 346, such as based on a signal from the auxiliary control circuit 206 or from the first force amplifier 310. The force control signal 334 can be transmitted using the first signal path 324 in the device interface 314 to the second device input node 354 at the second semiconductor device 308. In an example, the second device input node 354 is coupled to the buffer circuit network in the second semiconductor device 308. The buffer circuit network can include various buffer circuit instances that can be independently or selectively configured to provide an output signal to the DUT 130 in response to the force control signal 334.

The second signal path 328 can transmit a first DUT sense signal 342 from the second semiconductor device 308 to the first semiconductor device 304. The first DUT sense signal 342 can include a current or voltage signal received from the DUT 130, for example via the DUT sense resistor 370. The second semiconductor device 308 can provide the first DUT sense signal 342 at the second device feedback node 360, and the first semiconductor device 304 can receive the first DUT sense signal 342 at the first device feedback node 350.

The bidirectional signal path 332 can be configured to transmit a force-sense signal 338 between the first device dual-purpose node 352 at the first semiconductor device 304 and the second device dual-purpose node 356 at the second semiconductor device 308. Characteristics of the force-sense signal 338 can depend on an operating mode of the multiple-die force-sense test system 300. For example, in a test mode, the force-sense signal 338 can include an unbuffered, small-magnitude DUT force signal that is communicated from the first semiconductor device 304 to the DUT 130 by way of the second semiconductor device 308. In an auxiliary control mode or calibration mode, the force-sense signal 338 can include a second DUT sense signal that is received by the second semiconductor device 308 and communicated from the second semiconductor device 308 to the first semiconductor device 304.

In an example, the small-magnitude DUT force signal can be generated using a signal source on the first semiconductor device 304. In FIG. 3, the small-magnitude DUT force signal can be provided using at least one of a first switch 318 and a second switch 320. At least one of the first switch 318 and the second switch 320 can be configured to pass an output signal, such as from one of the first force amplifier 310 or from the auxiliary control circuit 206, to the first device dual-purpose node 352, and the first switch 318 and the second switch 320 can be independently-controlled. Respective signals provided via the first switch 318 and the second switch 320 can have different magnitude characteristics.

In another test mode of the multiple-die force-sense test system 300, the bidirectional signal path 332 can be configured to transmit the second DUT sense signal from the second semiconductor device 308 to the first semiconductor device 304. That is, the second semiconductor device 308 can receive DUT information from the DUT 130 and provide, at the second device dual-purpose node 356, the second DUT sense signal to the first device dual-purpose node 352 of the first semiconductor device 304. The second DUT sense signal can, in an example, be reported to a control system or can be received by the second selector circuit 326. In an example, the second device dual-purpose node 356 can provide the second DUT sense signal and the second device feedback node 360 can concurrently provide the first DUT sense signal 342.

The example of the multiple-die force-sense test system 300 includes various switches, sources, signal paths, and other devices that can be independently or jointly configured to provide a small-magnitude DUT current force signal. However, fewer or additional switches, sources, signal paths, and/or other devices can similarly be used. The example of the multiple-die force-sense test system 300 includes three buffer circuits, including the first buffer circuit 306, the second buffer circuit 312, and the third buffer circuit 316. However, fewer or additional buffer circuits can similarly be used.

Figure 4:
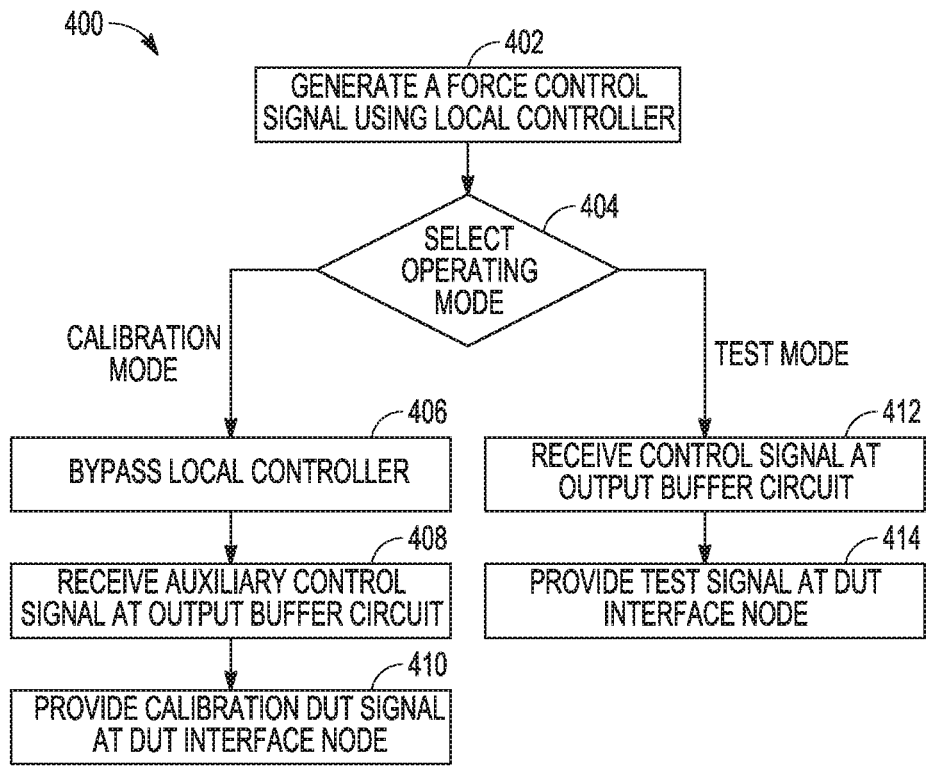
FIG. 4 illustrates generally an example of a method that can include providing test or calibration signals depending on an operating mode of a test system.

FIG. 4 illustrates generally an example of a first method 400 that can include providing test or calibration signals depending on an operating mode of a test system. In an example, the first method 400 can include or use one or more of the first force-sense test system 200 or the multiple-die force-sense test system 300.

At block 402, the first method 400 includes generating a force control signal using a local controller. For example, block 402 can include using the controller circuit 210 to provide a signal at the force control output node 224. The force control signal can be a DUT force signal or can be a signal that controls operation of one or more buffers in an output stage of the test system.

At decision block 404, the first method 400 includes selecting an operating mode for the test system. For example, the decision block 404 can include selecting between a calibration mode and a test mode. In the test mode, the system can be configured to perform DUT force or DUT sense functions, such as based on test control signals received from a test controller. The test controller, for example, can be configured to provide test control signals at the test control input node 214. In the calibration mode, the system can be configured to enable user-calibration of force or sense aspects of the system.

In the calibration mode, at block 406, the first method 400 includes bypassing a local controller, such as the controller circuit 210. For example, block 406 can include using the bypass circuit 218 to divert control over one or more aspects of the test system to an auxiliary controller. In an example, bypassing the local controller at block 406 can include using the first selector circuit 322 to selectively couple an output buffer circuit of the system to one of an auxiliary controller, such as the auxiliary control circuit 206, or to an integrated buffer driver, such as the controller circuit 210. The auxiliary controller can be configured to provide an auxiliary control signal to the buffer driver.

Further in the calibration mode, at block 408, the first method 400 includes receiving the auxiliary control signal at an output buffer circuit of the system. For example, block 408 can include receiving the auxiliary control signal from the auxiliary control circuit 206 at the buffer control node 226. The auxiliary control signal can be configured to drive one or more buffers in the output buffer circuit 222 to thereby provide a signal to the DUT 130. At block 410, the first method 400 includes providing a calibration DUT signal at a DUT interface node. For example, block 410 can include providing a calibration signal, based on the auxiliary control signal, at the DUT pin 128.

Returning to the decision block 404 and proceeding to the test mode, the first method 400 can include, at block 412, receiving a force control signal at an output buffer circuit of the system. Receiving the force control signal at the output buffer circuit can include, for example, receiving a signal from the first force amplifier 310 in the controller circuit 210, via the first selector circuit 322, at the buffer control node 226. At block 414, the first method 400 can include providing a test signal at a DUT interface node. Providing the test signal can include providing a test stimulus at the DUT pin 128, and the test stimulus can be based on the force control signal.

Figure 5:
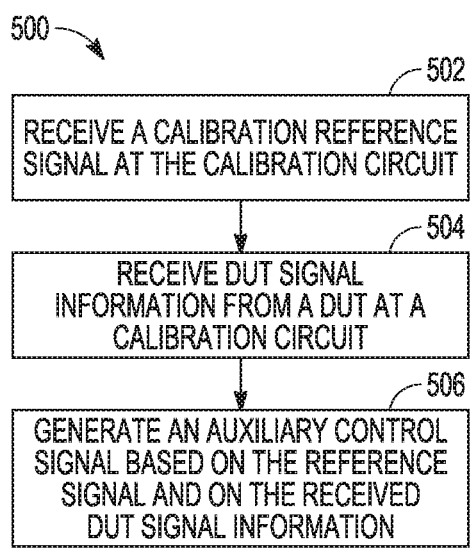
FIG. 5 illustrates generally an example of a method that can include generating an auxiliary control signal using a calibration circuit.

FIG. 5 illustrates generally an example of a second method 500 that can include generating an auxiliary control signal using a calibration circuit. The second method 500 can include or use calibration circuitry from one or more of the first force-sense test system 200 or the multiple-die force-sense test system 300. The auxiliary control signal can be provided to a test system, such as using the auxiliary input node 376, to control operation of output buffer circuitry of the system.

At block 502, the second method 500 can include receiving a calibration reference signal at the auxiliary control circuit 206. Receiving the reference signal can include receiving the calibration reference signal at the calibration input 364 of the calibration amplifier 362. The calibration reference signal can include the user-specified calibration signal, Vin, such as can be received from an external source, from a DAC in the auxiliary control circuit 206, or from another source.

At block 504, the second method 500 can include receiving DUT signal information, from a DUT, at the auxiliary control circuit 206. For example, the received DUT signal information can include DUT voltage or DUT current information from the DUT 130. In an example, at block 504, the auxiliary control circuit 206 can receive DUT current information via the current sense switch 372 and the DUT current sense node 378, and the auxiliary control circuit 206 can receive DUT voltage information via the voltage sense switch 374 and the DUT voltage sense node 380.

At block 506, the second method 500 can include generating an auxiliary control signal based on the reference signal and based on the received DUT signal information. For example, block 506 can include using a differential amplifier, such as the calibration amplifier 362, to generate the auxiliary control signal based on the calibration reference signal received at block 502 and based on the DUT signal information received at block 504. The calibration amplifier 362 can provide the auxiliary control signal at the auxiliary input node 376, for example, to control operation of output buffer circuitry in the system.

Various aspects of the present disclosure can help provide a solution to the test system-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a test equipment system. In an example, Aspect 1 can include a test equipment system for providing signals to, or receiving signals from, a device under test (DUT). Aspect 1 can include a system with output buffer circuitry configured to provide a DUT signal to the DUT in response to a force control signal at a buffer control node, and controller circuitry configured to provide the force control signal at the buffer control node, and bypass circuitry configured to selectively bypass the controller circuitry and provide an auxiliary control signal at the buffer control node.

Aspect 2 can include or use, or can optionally be combined with the subject matter of Aspect 1, to optionally include or use auxiliary control circuitry coupled to the bypass circuit and configured to provide the auxiliary control signal.

Aspect 3 can include or use, or can optionally be combined with the subject matter of Aspect 2, to optionally include the auxiliary control circuitry configured to receive information from the DUT and, in response, provide the auxiliary control signal.

Aspect 4 can include or use, or can optionally be combined with the subject matter of one or any combination of Aspects 1 through 3 to optionally include the controller circuitry comprising a feedback network with an amplifier, the amplifier including a first input node configured to receive a test control signal, a second input node configured to receive information from the DUT, and an amplifier output node configured to provide the force control signal based on a relationship between the test control signal and the information from the DUT.

Aspect 5 can include or use, or can optionally be combined with the subject matter of one or any combination of Aspects 1 through 4 to optionally include the bypass circuitry comprising a signal selector circuit configured to selectively couple the buffer control node to the controller circuitry or to an auxiliary source device, wherein the auxiliary source device can be configured to provide an auxiliary control signal to control the output buffer circuitry.

Aspect 6 can include or use, or can optionally be combined with the subject matter of Aspect 5, to optionally include a DUT voltage sense output node configured to provide information to the auxiliary source device about a voltage signal at a DUT node, wherein the auxiliary source device can be configured to provide the auxiliary control signal based on the information about the voltage signal at the DUT node.

Aspect 7 can include or use, or can optionally be combined with the subject matter of Aspect 5, to optionally include or use a DUT voltage sense output node configured to provide information to the auxiliary source device about a voltage signal at the DUT node, and a DUT current sense output node configured to provide information to the auxiliary source device about a current signal at the DUT node. Aspect 7 can include the auxiliary source device configured to provide the auxiliary control signal based on the information about the voltage signal at the DUT node or on the information about the current signal at the DUT node.

Aspect 8 can include or use, or can optionally be combined with the subject matter of one or any combination of Aspects 1 through 7 to optionally include or use a diode coupled to a resistor in the output buffer circuitry, wherein the diode can be configured to receive a calibration current signal from an external source device when the bypass circuitry bypasses the controller circuitry.

Aspect 9 can include or use, or can optionally be combined with the subject matter of one or any combination of Aspects 1 through 8 to optionally include the bypass circuitry including a first switch configured to selectively couple the buffer control node to the controller circuitry, and the bypass circuitry including a second switch configured to selectively couple the buffer control node to a source device that provides the auxiliary control signal.

Aspect 10 can include or use, or can optionally be combined with the subject matter of one or any combination of Aspects 1 through 9 to optionally include the output buffer circuitry comprising a first buffer and a first resistor coupled in series, and the output buffer circuitry can be configured to provide the DUT signal to the DUT via the first resistor in response to the force control signal at the buffer control node.

Aspect 11 can include or use, or can optionally be combined with the subject matter of Aspect 10, to optionally include or use a diode coupled to the DUT and the first resistor, wherein the diode can be configured to receive an auxiliary current signal from an auxiliary current source.

Aspect 12 can include or use, or can optionally be combined with the subject matter of one or any combination of Aspects 1 through 11 to optionally include the output buffer circuitry comprising multiple buffers coupled to the DUT via respective multiple output resistors, and one or more of the multiple buffers can be selected to provide the DUT signal to the DUT node based on a characteristic of the force control signal at the buffer control node.

Aspect 13 can include or use, or can optionally be combined with the subject matter of Aspect 12, to optionally include the controller circuitry comprising a portion of a first semiconductor die, the output buffer circuitry comprising a portion of a second semiconductor die that is different than the first semiconductor die, and the first semiconductor die can comprise relatively lower-bandwidth integrated devices and the second semiconductor die can comprise relatively higher-bandwidth integrated devices.

In an example, Aspect 14 can include a method for operating an automated test equipment (ATE) system. The ATE system can comprise one or more systems described herein, such as can include one or more of the Aspects 1 through 13 provided above. The method of Aspect 14 can include generating a force control signal using a local controller for a parametric measurement unit of the system, and in a test mode, receiving the force control signal at output buffer circuitry and, in response, providing a first device under test (DUT) signal to a DUT at a DUT interface node, and in an auxiliary control mode, bypassing the local controller and receiving an auxiliary control signal at the output buffer circuitry and, in response, providing a second DUT signal to the DUT.

Aspect 15 can include or use, or can optionally be combined with the subject matter of Aspect 14, to optionally include generating the auxiliary control signal using auxiliary control circuitry that is different than the local controller, and using a switching circuit, selecting one of the force control signal from the local controller or the auxiliary control signal from the auxiliary control circuitry, and providing the selected signal to the output buffer circuitry.

Aspect 16 can include or use, or can optionally be combined with the subject matter of one or any combination of Aspects 14 or 15 to optionally include bypassing the local controller using a multiplexer circuit to selectively couple the output buffer circuitry to the local controller or to a calibration signal source device that provides the auxiliary control signal.

Aspect 17 can include or use, or can optionally be combined with the subject matter of one or any combination of Aspects 14 through 16 to optionally include receiving voltage or current information from the DUT, and generating the auxiliary control signal based in part on the received voltage or current information from the DUT.

Aspect 18 can include or use, or can optionally be combined with the subject matter of one or any combination of Aspects 14 through 17 to optionally include generating the force control signal using a first digital-to-analog converter (DAC) circuit and a first reference signal, and wherein the auxiliary control signal is based on a different second reference signal.

In an example, Aspect 19 can include a system, or a portion of a system, for automated testing. The system can comprise or use one or more of the systems or methods described herein, such as can include one or more of the Aspects 1 through 18 provided above. The system of Aspect 19 can include a system for providing signals to, or receiving signals from, a device under test (DUT) at a DUT node. Aspect 19 can include a first integrated circuit (IC) comprising a portion of a first semiconductor die of a first semiconductor type, and the first IC can comprise a local controller configured to generate a local force control signal for a force-sense test system, and a bypass circuit configured to provide a buffer control signal to an output buffer circuit based on the local force control signal from the local controller or on an auxiliary control signal from an external auxiliary controller for the same force-sense test system.

Aspect 20 can include or use, or can optionally be combined with the subject matter of Aspect 19, to optionally include or use a second IC, wherein the second IC comprises a portion of a second semiconductor die of a second semiconductor type, and the second IC comprises the output buffer circuit.

Aspect 21 can include or use, or can optionally be combined with the subject matter of Aspect 20, to optionally include the output buffer circuit comprising multiple buffers coupled to the DUT node via respective multiple resistors, and one or more of the multiple buffers can be selected to provide a force signal to the DUT node based on a characteristic of the buffer control signal.

Aspect 22 can include or use, or can optionally be combined with the subject matter of one or any combination of Aspects 19 through 21 to optionally include the output buffer circuit comprising a first buffer and a first resistor coupled in series, wherein the output buffer circuit can be configured to provide a force signal to the DUT node, via the first resistor, in response to the buffer control signal.

Aspect 23 can include or use, or can optionally be combined with the subject matter of Aspect 22, to optionally include or use a diode coupled to the DUT node and the first resistor, wherein the diode is configured to receive an auxiliary current signal from the external auxiliary controller.

Aspect 24 can include or use, or can optionally be combined with the subject matter of one or any combination of Aspects 19 through 23 to optionally include the bypass circuit comprising a plurality of switches that are configured to selectively provide DUT information, received from the DUT, to the external auxiliary controller.

Aspect 25 can include or use, or can optionally be combined with the subject matter of one or any combination of Aspects 19 through 24 to optionally include or use the external auxiliary controller, wherein the external auxiliary controller comprises a calibration signal source configured to provide a calibration signal for calibrating one or more components of the force-sense test system.

Aspect 26 can include or use, or can optionally be combined with the subject matter of one or any combination of Aspects 19 through 25 to optionally include the first IC further comprising a DUT current sense output node configured to provide current information to the external auxiliary controller about a current signal at the DUT node, and a voltage sense output node configured to provide voltage information to the external auxiliary controller about a voltage signal at the DUT node.

Aspect 27 can include or use, or can optionally be combined with the subject matter of one or any combination of Aspects 19 through 26 to optionally include the output buffer circuit comprising multiple buffers coupled to the DUT node via respective multiple resistors, and one or more of the multiple buffers can be selected to provide a force signal to the DUT node based on a characteristic of the buffer control signal.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A test equipment system for providing signals to, or receiving signals from, a device under test (DUT), the system comprising:
   output buffer circuitry configured to provide a DUT signal to the DUT in response to a force control signal at a buffer control node;
   controller circuitry configured to provide the force control signal at the buffer control node; and
   bypass circuitry configured to selectively bypass the controller circuitry and provide an auxiliary control signal at the buffer control node.

2. The test equipment system of claim 1, further comprising auxiliary control circuitry coupled to the bypass circuitry and configured to provide the auxiliary control signal.

3. The test equipment system of claim 2, wherein the auxiliary control circuitry is configured to receive information from the DUT and, in response, provide the auxiliary control signal.

4. The test equipment system of claim 1, wherein the bypass circuitry comprises a signal selector circuit configured to selectively couple the buffer control node to the controller circuitry or to an auxiliary source device, wherein the auxiliary source device is configured to provide the auxiliary control signal to control the output buffer circuitry.

5. The test equipment system of claim 4, further comprising a DUT voltage sense output node configured to provide information to the auxiliary source device about a voltage signal at a DUT node;
   wherein the auxiliary source device is configured to provide the auxiliary control signal based on the information about the voltage signal at the DUT node.

6. The test equipment system of claim 4, further comprising:
   a DUT voltage sense output node configured to provide information to the auxiliary source device about a voltage signal at the DUT node; and
   a DUT current sense output node configured to provide information to the auxiliary source device about a current signal at the DUT node; and
   wherein the auxiliary source device is configured to provide the auxiliary control signal based on the information about the voltage signal at the DUT node or on the information about the current signal at the DUT node.

7. The test equipment system of claim 1, further comprising a diode coupled to a resistor in the output buffer circuitry, wherein the diode is configured to receive a calibration current signal from an external source device when the bypass circuitry bypasses the controller circuitry.

8. The test equipment system of claim 1, wherein the bypass circuitry includes a first switch configured to selectively couple the buffer control node to the controller circuitry, and the bypass circuitry includes a second switch configured to selectively couple the buffer control node to a source device that provides the auxiliary control signal.

9. The test equipment system of claim 1, wherein the output buffer circuitry comprises multiple buffers coupled to the DUT via respective multiple output resistors, and wherein one or more of the multiple buffers is selected to provide the DUT signal to the DUT node based on a characteristic of the force control signal at the buffer control node.

10. The test equipment system of claim 9, wherein:
    the controller circuitry comprises a portion of a first semiconductor die; and
    the output buffer circuitry comprises a portion of a second semiconductor die that is different than the first semiconductor die; and
    wherein the first semiconductor die comprises lower-bandwidth integrated devices, and the second semiconductor die comprises relatively higher-bandwidth integrated devices.

11. A method for operating an automated test equipment (ATE) system, the method comprising:
    generating a force control signal using a local controller for a parametric measurement unit of the system;
    in a test mode, receiving the force control signal at output buffer circuitry and, in response, providing a first device under test (DUT) signal to a DUT at a DUT interface node; and
    in an auxiliary control mode, bypassing the local controller and receiving an auxiliary control signal at the output buffer circuitry and, in response, providing a second DUT signal to the DUT.

12. The method of claim 11, further comprising:
    generating the auxiliary control signal using auxiliary control circuitry that is different than the local controller; and
    using a switching circuit, selecting one of the force control signal from the local controller or the auxiliary control signal from the auxiliary control circuitry and providing the selected signal to the output buffer circuitry.

13. The method of claim 11, wherein bypassing the local controller includes using a multiplexer circuit to selectively couple the output buffer circuitry to the local controller or to a calibration signal source device that provides the auxiliary control signal.

14. The method of claim 11, further comprising:
    receiving voltage or current information from the DUT; and
    generating the auxiliary control signal based in part on the received voltage or current information from the DUT.

15. A system for providing signals to, or receiving signals from, a device under test (DUT) at a DUT node, the system comprising:
    an first integrated circuit (IC) comprising a portion of a first semiconductor die of a first semiconductor type, the first IC comprising:
    a local controller configured to generate a local force control signal for a force-sense test system; and
    a bypass circuit configured to provide a buffer control signal to an output buffer circuit based on the local force control signal from the local controller or on an auxiliary control signal from an external auxiliary controller for the same force-sense test system.

16. The system of claim 15, further comprising the external auxiliary controller, wherein the external auxiliary controller comprises a calibration signal source configured to provide a calibration signal for calibrating one or more components of the force-sense test system.

17. The system of claim 15, comprising a second IC, wherein the second IC comprises a portion of a second semiconductor die of a second semiconductor type, and the second IC comprises the output buffer circuit.

18. The system of claim 17, further comprising a diode and a first resistor;
    wherein the output buffer circuit comprises a first buffer and the first resistor coupled in series,
    wherein the output buffer circuit is configured to provide a force signal to the DUT node, via the first resistor, in response to the buffer control signal; and wherein the diode is configured to receive an auxiliary current signal from the external auxiliary controller.

19. The system of claim 15, wherein the bypass circuit comprises a plurality of switches that are configured to selectively provide DUT information, received from the DUT, to the external auxiliary controller.

20. The system of claim 15, wherein the first IC further comprises:
   a DUT current sense output node configured to provide current information to the external auxiliary controller about a current signal at the DUT node; and
   a voltage sense output node configured to provide voltage information to the external auxiliary controller about a voltage signal at the DUT node.

\* \* \* \* \*